United States Patent
Ghosh et al.

(10) Patent No.: US 12,367,914 B2
(45) Date of Patent: Jul. 22, 2025

(54) CIRCUIT TOPOLOGY FOR HIGH PERFORMANCE MEMORY WITH SECONDARY PRE-CHARGE TRANSISTOR

(71) Applicant: Intel Corporation, Santa Clara, CA (US)

(72) Inventors: Arindrajit Ghosh, College Station, TX (US); Jaymeen Bharatkumar Aseem, Ahmedabad (IN)

(73) Assignee: Intel Corporation, Santa Clara, CA (US)

( * ) Notice: Subject to any disclaimer, the term of this patent is extended or adjusted under 35 U.S.C. 154(b) by 614 days.

(21) Appl. No.: 17/688,307

(22) Filed: Mar. 7, 2022

(65) Prior Publication Data

US 2023/0282255 A1    Sep. 7, 2023

(51) Int. Cl.
*G11C 7/12*      (2006.01)
*G11C 7/18*      (2006.01)
*G11C 17/18*    (2006.01)

(52) U.S. Cl.
CPC .................. *G11C 7/12* (2013.01); *G11C 7/18* (2013.01); *G11C 17/18* (2013.01); *G11C 2207/2281* (2013.01)

(58) Field of Classification Search
CPC ... G11C 7/12; G11C 17/18; G11C 2207/2281; G11C 7/18
USPC ........................................................ 365/203
See application file for complete search history.

(56) References Cited

U.S. PATENT DOCUMENTS

| | | | |
|---|---|---|---|
| 6,507,531 B1 | 1/2003 | Zhang | |
| 7,123,500 B2 | 10/2006 | Ye et al. | |
| 8,448,010 B2 | 5/2013 | Damaraju et al. | |
| 8,488,390 B2 | 7/2013 | Kulkarni et al. | |
| 8,605,480 B2 * | 12/2013 | Jain | G11C 11/5692 365/104 |
| 9,336,008 B2 | 5/2016 | Damaraju et al. | |
| 9,633,716 B2 | 4/2017 | Kulkarni et al. | |
| 10,403,627 B2 * | 9/2019 | Van Houdt | H10D 84/07 |
| 10,825,509 B2 | 11/2020 | Sumbul et al. | |
| 2009/0262587 A1 * | 10/2009 | Park | G11C 11/4076 365/207 |

* cited by examiner

*Primary Examiner* — Ly D Pham
(74) *Attorney, Agent, or Firm* — Schwabe, Williamson & Wyatt, P.C.

(57) ABSTRACT

Embodiments herein relate to a memory device in which a secondary pre-charge transistor is coupled to each bit line in an array of memory cells. A column select transistor such as an nMOS is between the secondary pre-charge transistor such as a pMOS and a power supply node. The secondary pre-charge transistor and the column select transistor have their control gates connected so that they are controlled by a common control signal. The secondary pre-charge transistor prevents floating of the bit line voltage in a read operation and maintains a voltage of the bit line in a specified range.

15 Claims, 12 Drawing Sheets

| Example | Low power issue | Leakage power | Performance | Area |
|---|---|---|---|---|
| FIG. 2B | Yes | Reference | Reference | Reference |
| FIG. 7 | No | higher | Lower | Reference |
| FIG. 8 | No | higher | Lower | Larger |

CIRCUIT TOPOLOGY FOR HIGH PERFORMANCE MEMORY WITH SECONDARY PRE-CHARGE TRANSISTOR

FIELD

The present application generally relates to the field of memory devices and more particularly, to a memory array and an associated read operation.

BACKGROUND

Memory devices include both volatile and non-volatile memory cells. The memory cells can be arranged in an array where word lines and bit lines allow access to the memory cells. Furthermore, a read operation for such memory cells can rely on sensing a voltage on a bit line. However, various challenges are presented in accurately reading the memory cells.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
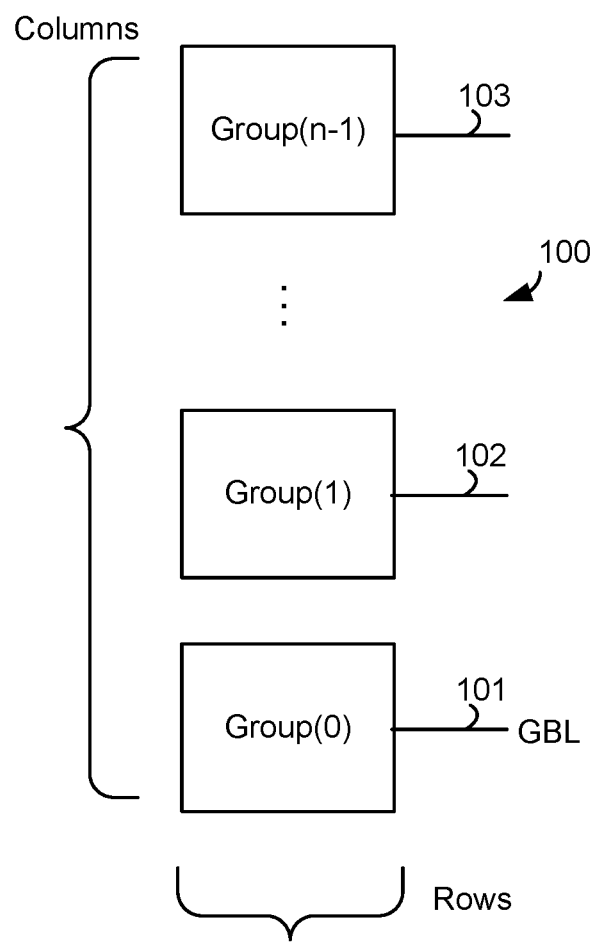
FIG. 1 depicts an example arrangement of groups of cells in a memory device, in accordance with various embodiments.

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The terms "substantially." "close." "approximately." "near." and "about." generally refer to being within +/−10% of a target value. Unless otherwise specified the use of the ordinal adjectives "first." "second." and "third." etc., to describe a common object, merely indicate that different instances of like objects are being referred to, and are not intended to imply that the objects so described must be in a given sequence, either temporally, spatially, in ranking or in any other manner.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments." which may each refer to one or more of the same or different embodiments. Furthermore, the terms "comprising." "including." "having." and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

The terms "coupled," "communicatively coupled," along with derivatives thereof are used herein. The term "coupled" may mean two or more elements are in direct physical or electrical contact with one another, may mean that two or more elements indirectly contact each other but still cooperate or interact with each other, and/or may mean that one or more other elements are coupled or connected between the elements that are said to be coupled with each other. The term "directly coupled" may mean that two or more elements are in direct contact with one another. The term "communicatively coupled" may mean that two or more elements may be in contact with one another by a means of communication including through a wire or other interconnect connection, through a wireless communication channel or link, and/or the like.

As mentioned at the outset, various challenges are presented in accurately reading memory cells. For example, read operations can be affected by changes in the power supply voltage. The power supply voltage can be decreased below a nominal level as a power saving measure in the memory device, such as when an associated battery level has dropped below a threshold. The power saving mode allows the memory device to perform its primary functions and is often accompanied by a reduction in the processor clock speed. However, read operations are sensitive to changes in the power supply voltage and such changes can lead to inaccurate results.

For example, for a column of memory cells coupled to a bit line, a column select transistor may be used to control charging and discharging of the bit line in a read operation. A power supply node at a power supply voltage is coupled to the column select transistor. When the column select transistor is turned on, the bit line can be pre-charged by the power supply voltage. A selected word line voltage can then be elevated while the column select transistor remains turned on to allow a discharge of the bit line to be detected. The amount of discharge indicates a state of a selected memory cell, e.g., 0 or 1. In one approach, a 1 bit is associated with a high bit line voltage with little discharge and a 0 bit is associated with a low bit line voltage with substantial discharge. However, if the power supply voltage decreases sufficiently, the column select transistor may not turn on as expected. This can lead to undesirable results such as floating of the bit line voltage.

The techniques disclosed herein address the above and other issues. In one aspect, a secondary pre-charge (SP) transistor is coupled to each bit line in an array of memory cells, at an SP node of the bit line. There can be one secondary pre-charge transistor per bit line. The column select transistor is between the secondary pre-charge transistor and the power supply node. The power supply node may be a transistor coupled to a power supply voltage. In an example implementation, the column select transistor is an nMOSFET (n-type metal-oxide-semiconductor field effect transistor), or nMOS, transistor and the secondary pre-charge transistor is a pMOS (p-type MOSFET). The secondary pre-charge transistor may prevent floating of the bit line voltage in a read operation by maintaining a voltage of the bit line in a specified, relatively low range. For example, the specified range may be between Vthp and Vdd−Vthn, where Vthp is a threshold voltage of the pMOS transistor, Vth is a threshold voltage of the nMOS transistor and Vdd is the power supply voltage.

These and other features will be apparent in view of the following discussion.

FIG. 1 depicts an example arrangement of groups of cells in a memory device 100, in accordance with various embodiments. The memory device 100 includes a number n groups of memory cells, e.g., Group(0), Group(1), . . . , Group(n−1). Each group can include memory cells arranged in rows and columns of an array. In one approach, one memory cell in each group is read at a given time so that n memory cells are read concurrently, one from each group. Each group of memory cells may be coupled to a global bit line (GBL) 101, 102, . . . , 103 which is part of a sense circuit. See also FIGS. 2A and 5A. The memory cells may include volatile or non-volatile memory cells. Examples of volatile memory include random access memory (RAM) and examples of non-volatile memory include read-only memory (ROM) and register files.

Figure 2A:
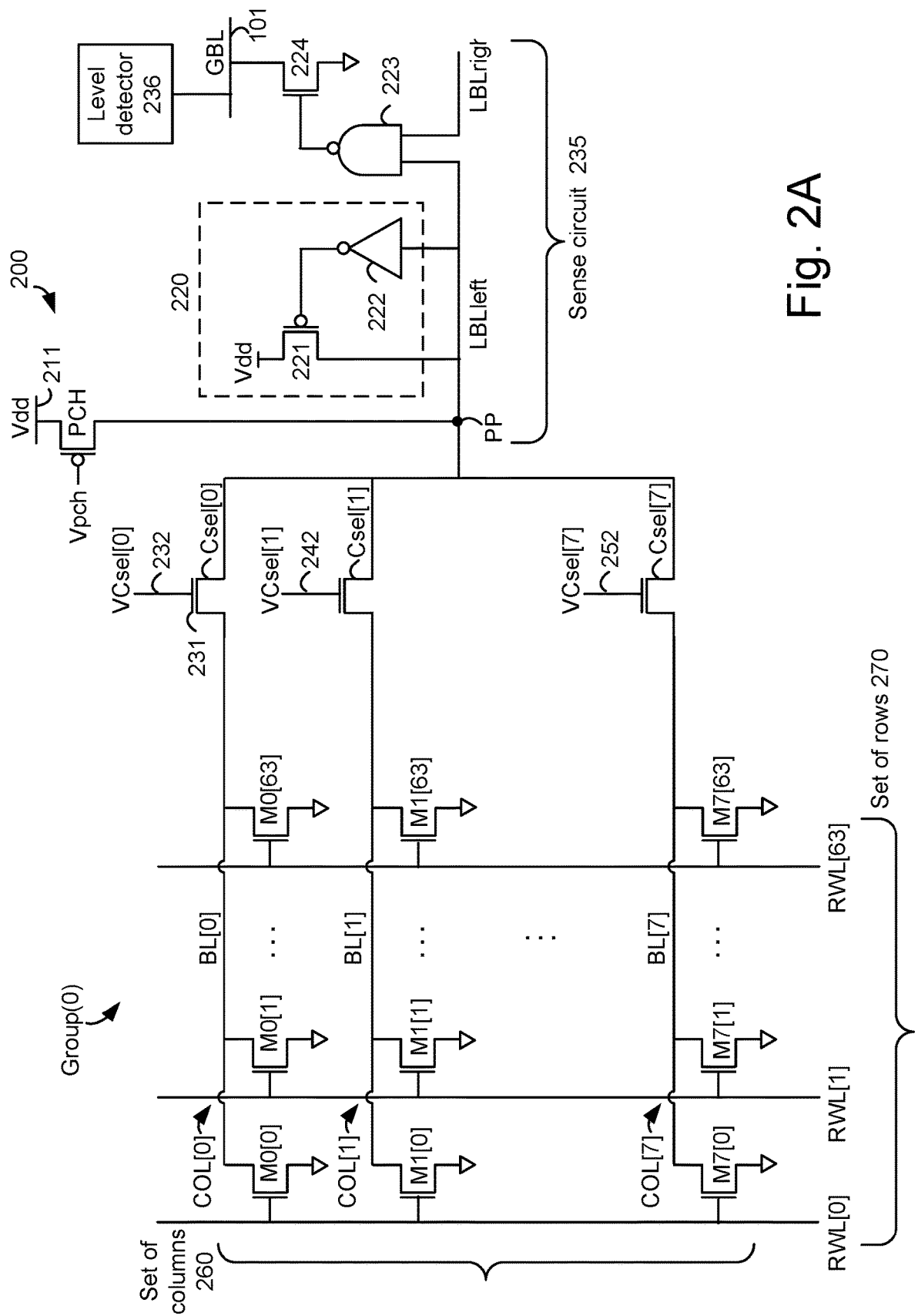
FIG. 2A depicts an example circuit diagram for one of the groups of cells of FIG. 1, where a secondary pre-charge transistor is not coupled to each bit line, in accordance with various embodiments.

FIG. 2A depicts an example circuit diagram for one of the groups of cells of FIG. 1, Group (i), where a secondary pre-charge transistor is not coupled to each bit line, in accordance with various embodiments. The circuit is presented as a comparison to the circuit of FIG. 5A. The circuit 200 includes the group of memory cells, Group(0), and a sense circuit 235. The group includes a set of columns 260 of memory cells. In particular, eight columns COL[0]-COL[7] of memory cells are depicted as an example only. Additionally, the memory cells are arranged in a set of sixty-four rows 270, again as an example only. Each row is associated with a word line, RWL[0]-RWL[63]. The memory cells in COL[0] include M0[0]-M0[63], which are coupled to a bit line BL[0], the memory cells in COL[1] include M1[0]-M1[63], which are coupled to a bit line BL[1], . . . , and the memory cells in COL[7] include M7[0]-M7[63], which are coupled to a bit line BL[7]. Furthermore, RWL[0] is coupled to memory cells M0[0], M1[0], . . . , M7[0], RWL[1] is coupled to memory cells M0[1], M1[1], . . . , M7[1], and RWL[63] is coupled to memory cells M0[63], M1[63], . . . , M7[63]. The memory cells of each column are coupled to a respective bit line as indicated.

Each respective bit line BL[0]-BL[7] is also coupled to a respective column select transistor Csel[0]-Csel[7]. Each column select transistor Csel[0]-Csel[7] has a control gate coupled to a respective control gate voltage VCsel[0]-VCsel[7], respectively. For example, VCsel[0] is coupled to the control gate 231 of Csel[0].

The bit lines and column select transistors are in turn coupled to a common primary pre-charge node PP at a left-side local bit line (LBLleft). LBLleft and a right-side local bit line (LBLright) are coupled to a NAND gate 223 which in turn is coupled to the control gate of a transistor 224. The transistor 224 has a drain coupled to a global bit line (GBL) and a source coupled to ground. LBLleft is also coupled to a keeper circuit 220. The keeper circuit includes a pMOS transistor 221 and an inverter 222. An output of the inverter is coupled to a control gate of the pMOS transistor 221. A source of the pMOS transistor is coupled to the power supply voltage Vdd and a drain of the pMOS transistor is coupled to the PP node.

During a pre-charge phase of a read operation, the selected bit line and the PP node are charged to a high level, and during an evaluation or sensing phase of the read operation, the selected bit line and the PP node are allowed to discharge to a low level or remain charged at a high level depending on the data state of the selected memory cell, which can act as a pulldown device if it is in a strongly conductive or turned on state. The keeper circuit assists in keeping the node charged high if it is supposed to evaluate to high. Therefore, the keeper circuit should be strong enough to resist noise, leakage, etc. that would otherwise cause the node to errantly discharge to a low value. At the same time, however, the keeper circuit should not be too strong that prevents the node from quickly discharging when it is supposed to discharge.

In this example configuration, the memory cells are ROM cells which include a control gate coupled to a respective word line, a drain coupled to a respective bit line and a source coupled to ground. Each memory cell can store a bit of data, e.g., a 0 or 1 state, in one approach. In one state, the cell allows current to easily flow from the bit line to ground. In the other state, the cell does not allow current to flow from the bit line to ground, expect for a leakage current. The state of a selected memory cell can be determined in a read operation by pre-charging the associated bit line while the word line voltage is low, then raising the word line voltage and sensing an amount of discharge, or voltage, of the bit line.

For example, LBLright can be set at a 1 level so that the output of the NAND gate is 0 only if LBLleft is also at a 1 level. The output of the NAND gate turns on the transistor in this case to ground the voltage of a global bit line, GBL. This grounding can be detected by a level detector 236. If LBLleft is at a 0 level, the output of the NAND gate is at a 1 level. The output of the NAND gate keeps the transistor off in this case.

A primary pre-charge transistor PCH can be coupled to a power supply voltage Vdd at a power supply node 211. The primary pre-charge transistor can be a pMOS transistor having a control gate coupled to a voltage Vpch. When Vpch is sufficiently low, e.g., at 0 V, the PCH transistor acts as a pass gate to pass Vdd to the PP node. To pre-charge a selected bit line in a read operation, a control gate signal is applied to the corresponding column select transistor to allow the bit line to communicate with the PP node. The corresponding word line voltage is low at this time so that the memory cell cannot act as a pulldown regardless of its data state. Once the pre-charge occurs, the voltage of the selected word is elevated so that the memory cell may or may not acts as a pulldown based on its data state. The level of the PP node then indicates the state of the memory cell.

Although ROM memory is depicted as an example, the techniques herein are applicable to other types of memory including domino based memory as well as any kind of domino logic level gate. Domino logic is a CMOS-based evolution of the dynamic logic techniques based on either pMOS or nMOS transistors.

Figure 2B:
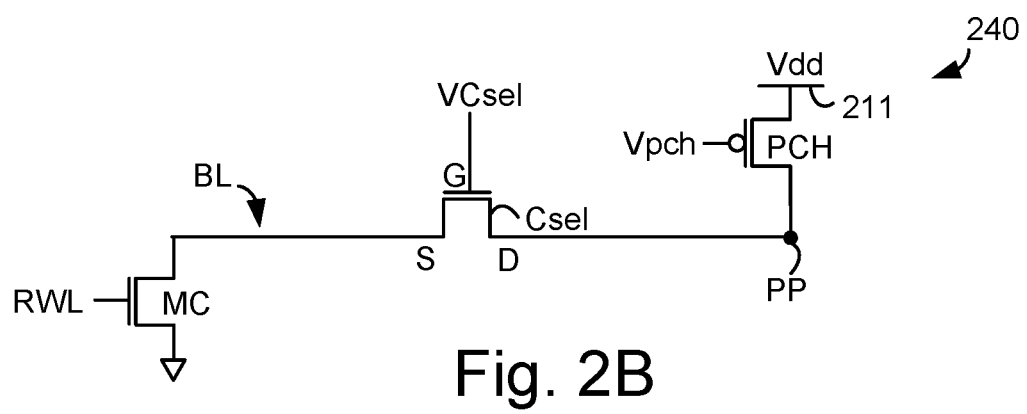
FIG. 2B depicts an example circuit based on a portion of the circuit of FIG. 2A, in accordance with various embodiments.

FIG. 2B depicts an example circuit 240 based on a portion of the circuit of FIG. 2A, in accordance with various embodiments. The circuit depicts a column including a memory cell MC, a word line RWL, a bit line BL and a column select transistor Csel. Csel has gate (G), source (S) and drain (D) terminals. The primary pre-charge node (PP) is also depicted with the primary pre-charge transistor PCH and the power supply node 211. This example does not include a secondary pre-charge transistor and is presented as a comparison to the circuit of FIG. 5B.

Generally, memory array topologies with column multiplexing employ a floating read bit line (e.g., a local bit line or LBL). This can result in a so-called supercharging issue during read operations at the system on a chip (SoC) level, where the power supply voltage decreases from Vddh to Vdd. See also FIG. 3A. As mentioned, the power supply voltage of the SoC may be reduced, e.g., from a high level Vddh=1.1 V to a lower level Vdd=0.55 V, in a power saving mode of the device. For example, Dynamic Voltage and Frequency Scaling (DVFS) is a power-management technique which decreases the clock frequency of a processor to allow a corresponding reduction in the supply voltage. This type of scenario frequently occurs at the SoC level.

This reduction in the power supply results in the possibility of holding a voltage Vddh−Vthn at the bit line as its voltage floats. A subsequent read operation with the lower power supply voltage, Vdd, can experience a significant performance penalty in terms of the time needed to begin the read operation.

Figure 3A:
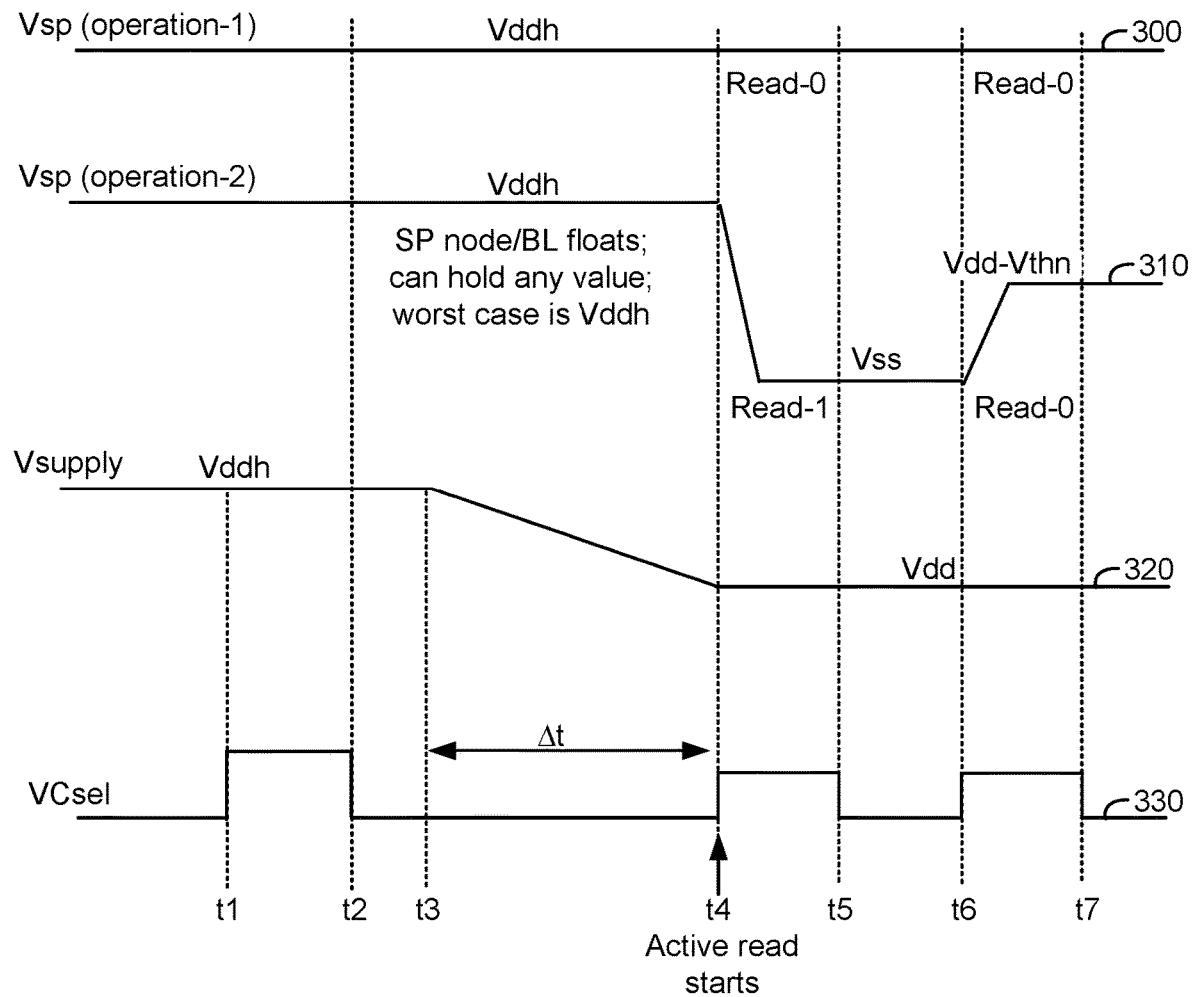
FIG. 3A depicts example waveforms which depict the effects of supercharging in example read operations with the circuits of FIGS. 2A and 2B, where the supply voltage decreases from Vddh to Vdd, in accordance with various embodiments.

FIG. 3A depicts example waveforms which depict the effects of supercharging in example read operations with the circuits of FIGS. 2A and 2B, where the supply voltage decreases from Vddh to Vdd, in accordance with various embodiments. A plot 300 depicts Vsp in a first operation, a plot 310 depicts Vsp in a second operation, a plot 320 depicts Vsupply and a plot 330 depicts VCsel. In this example, Vsupply is high, at Vddh, from t1-t3, then transitions from Vddh to Vdd at t3-t4 (Δt), before settling at Vdd at t4-t7. VCsel goes high from t1-t2, t4-t5 and t6-t7. Active read begins at t4.

The operations involve read-0 and read-1. Read-0 is a read operation for a memory cell which has a bit value of 1 and provides only a leakage path for a bit line, and read-1 is a read operation for a memory cell which has a bit value of 0 and provides a strong, direct discharge path for a bit line. Specifically, with read-0, the local bit-line (BL) holds a high value. In this example, it is a domino path, where the domino path is followed by an inverter (CMOS logic) so an inversion is performed, resulting in a low or 0 value. In this case, all bit cells will leak as their gate voltage is 0 V. With read-1, the local bit-line discharge from a LBL high value to a low value. Again, with a domino path, inverter logic will be uses, resulting in a high or 1 value. In this case, among the 64 bit cells connected to the bit line, one bit-cell gate voltage will be high and the LBL node will discharge through that transistor.

In the plot 300, the operation involves a read-0 at t4-t5 and t6-t7. During the read-0, the SP node/BL holds Vddh.

In the plot 310, the operation involves a read-1 at t4-t5 and a read-0 at t6-t7. In this case, the SP node/BL can float, and can hold any voltage value, where in the worst case it holds Vddh. During the read-1, at t4-t5, the SP node/BL discharges to Vss, then increases to Vdd−Vthn at t6 and remains at that level.

These plots demonstrate a supercharging effect in which charge is held at the SP node due to the Csel transistor being cutoff. In particular, assume the memory device is going to be operated at two different supply voltage levels, Vddh and Vdd, where Vddh is supplied before Vdd and Vddh>Vdd. In the circuit of FIG. 2B, there is no pre-charge device at the SP node. Accordingly, the SP node may hold a voltage as high as Vddh. In this case, to turn ON the Csel device, we require Vgs>=Vthn. But here, Vgs=Vdd−Vddh, which is a negative voltage, so the Csel device will be in cutoff (turned off) mode. As a result, the PP node will not be able to discharge until the time that Vgs is not >=Vthn. This effect, referred to as supercharging, will slow down the discharge path.

Figure 5A:
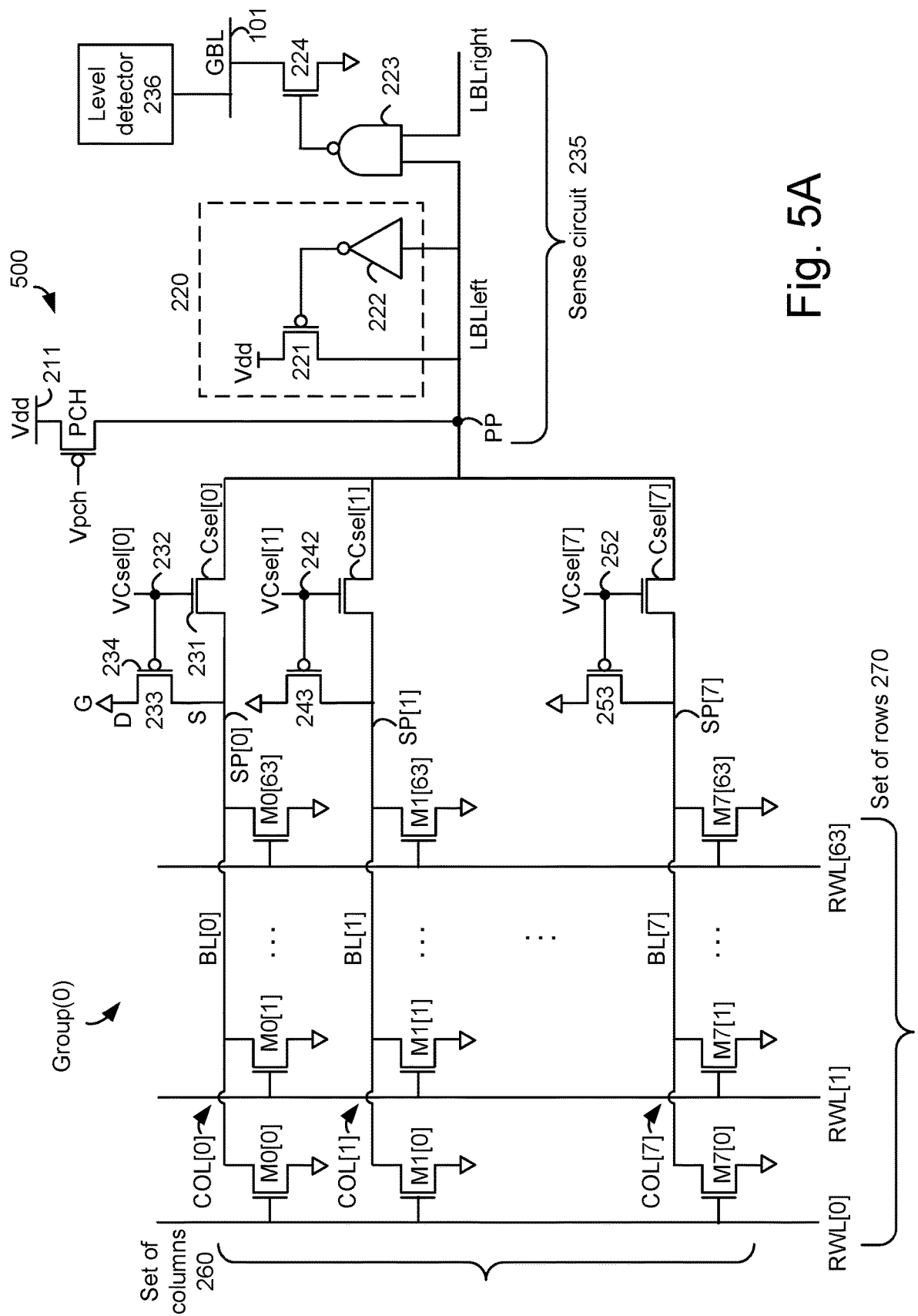
FIG. 5A depicts an example circuit diagram for one of the groups of cells of FIG. 1, where secondary pre-charge transistors are coupled to bit lines BL[0]-BL[63], respectively, in accordance with various embodiments.
Figure 5B:
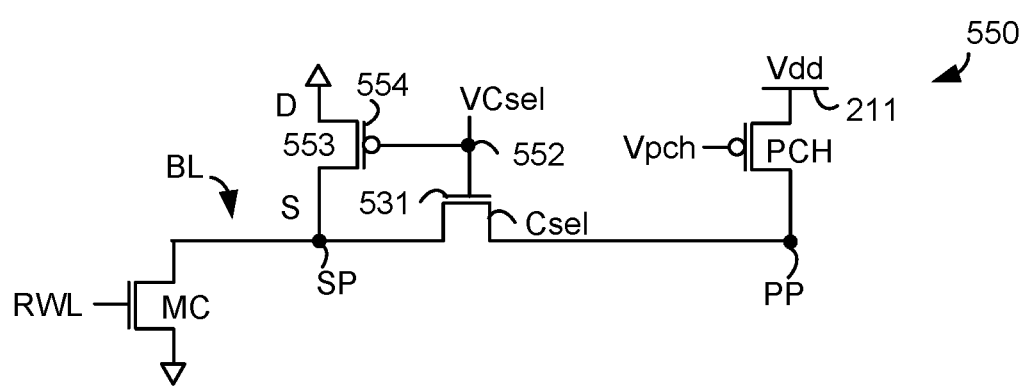
FIG. 5B depicts an example circuit representing a portion of the circuit of FIG. 5A, where a pre-charge transistor 553 controlled by the column select signal VCsel is added at the SP node, in accordance with various embodiments.

In contrast, the circuits of FIGS. 5A and 5B use a secondary pre-charge device such as a pMOS device at the SP node to resolve this problem. It prevents the Csel from going into a cutoff region when it is going to be turned on. In particular, the SP node does not hold a voltage greater than Vdd, for example.

Figure 3B:
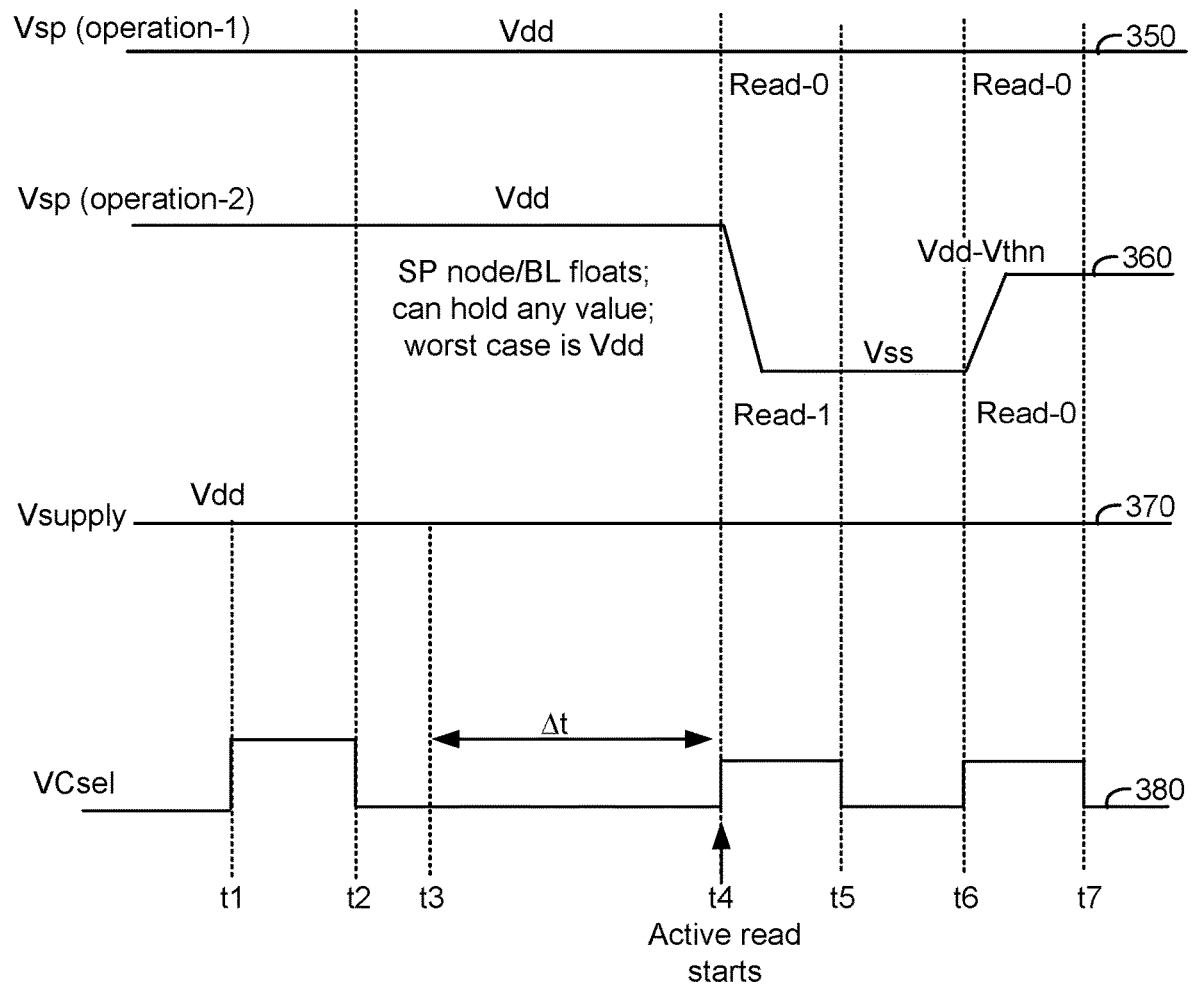
FIG. 3B depicts example waveforms which depict the effects of supercharging in example read operations with the circuits of FIGS. 2A and 2B, where the supply voltage is constant at Vdd, in accordance with various embodiments.

FIG. 3B depicts example waveforms which depict the effects of supercharging in example read operations with the circuits of FIGS. 2A and 2B, where the supply voltage is constant at Vdd, in accordance with various embodiments.

A plot 350 depicts Vsp in a first operation, a plot 360 depicts Vsp in a second operation, plot 370 depicts Vsupply and a plot 380 depicts VCsel. In this example, Vsupply is fixed at Vdd. As in FIG. 3A, VCsel goes high from t1-t2, t4-t5 and t6-t7. Active read begins at t4.

In the plot 350, the first operation involves a read-0 at t4-t5 and t6-t7. During the read-0, the SP node/BL holds Vdd.

In the plot 360, the second operation involves a read-1 at t4-t5 and a read-0 at t6-t7. In this case, the SP node/BL can float, and can hold any voltage value, where in the worst case it holds Vdd. During the read-1, at t4-t5, the SP node/BL discharges to Vss, then increases to Vdd−Vthn at t6 and remains at that level.

As with FIG. 3A, these plots demonstrate a supercharging effect in which charge is held at the SP node due to the Csel transistor being cutoff.

Figure 4:
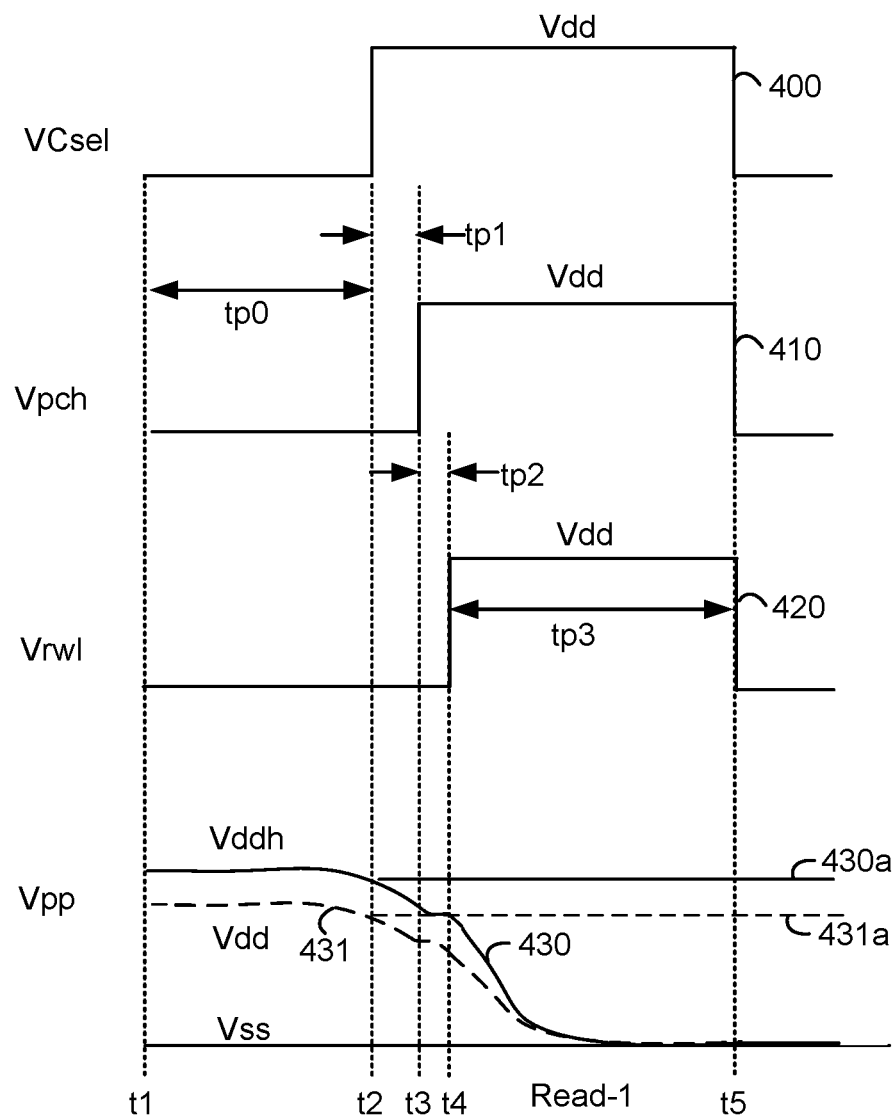
FIG. 4 depicts example waveforms in a read operation in two scenarios involving high and low supply voltages, Vddh and Vdd, respectively, in accordance with various embodiments.

FIG. 4 depicts example waveforms in a read operation in two scenarios involving high and low supply voltages, Vddh and Vdd, respectively, in accordance with various embodiments. A plot 400 denotes VCsel, a plot 410 denotes Vpch and a plot 420 denotes Vrwl. In a first scenario, before t1, the supply voltage is initially at Vddh then decreases to Vdd. In a second scenario, before t1, the supply voltage is initially at Vddh then decreases to Vdd. Plots 430 and 430a denote Vpp, the voltage at the PP node, in the first scenario, which is consistent with FIG. 3A. Plots 431 and 431a denote Vpp in the second scenario, which is consistent with FIG. 3B.

In a time period tp0, starting at t1, VCsel, Vpch and Vrwl are low. The PCH transistor (a pMOS) is on (conductive) so that Vddh or Vdd will be present at the PP node. Vsp will settle at an initial voltage Vt0 which is less than Vddh−Vthn. There can also be a leakage component through MC. Vsp will be a function of the leakage through the MC.

In the time period tp1, starting at t2, VCsel goes high, e.g., to Vdd. In a time period tp2, starting at t3, if Vt0>Vdd, the column select transistor will be off. After t1, also, Vsp will hold Vt0=Vt1. Vpch goes high ay t3 so that the PCH transistor turns off (non-conductive), disconnecting the power supply from the PP node. Vsp will therefore be much less than Vddh+Vthn. There can also be a leakage component through MC.

In a time period tp3, starting at t4, the column select transistor will be turned on once Vgs>Vthn, where Vgs is the gate-to-source voltage and Vthn is the threshold voltage. Vrwl goes high so that the memory cell can pull down the bit line, depending on its data state. Vsp can therefore discharge from its previous level of much less than Vdd+Vthn to Vss.

If the threshold voltage of the SP transistor Vt0>Vdd−Vthn, corresponding to the plot 430, the discharge time will be greater, e.g., about 50% greater, compared to the case of Vt0<Vdd−Vthn, as represented by the plot 431. This is a discharge time needed for the sensing operation. Generally, this time penalty applies when there is a strong discharge path through the memory cell, and the LBL node discharges from a high, pre-charged value to a low value when the word line voltage turns on the memory cell. This is referred to as a read-1 case, where the bit value 0 is held at the bit line.

On the other hand, there is a shorter time needed for the read-0 case, when the bit value 1 is held at the bit line and there is no direct discharge path through the memory cell. Instead, there is only a leakage path through the memory cell (bit-cell). For example, see the plot 430a with Vddh at the PP node and the plot 431a with Vdd at the PP node. Note that leakage plays an important role. If Vdd−Vt0>Vthn at t2, there is no impact for read-1.

FIG. 5A depicts an example circuit diagram for one of the groups of cells of FIG. 1, where secondary pre-charge transistors are coupled to bit lines BL[0]-BL[63], respectively, in accordance with various embodiments. The circuit 500 has the same components as the circuit 200 of FIG. 2A but further includes secondary pre-charge transistors. In particular, each respective bit line may be coupled to a respective secondary pre-charge transistor. For example, BL[0], BL[1] and BL[7] are coupled to secondary pre-charge transistors 233, 243 and 253, respectively, at secondary pre-charge nodes SP[0]-SP[7], respectively. Each secondary pre-charge transistor may be a pMOS, for example, having a source coupled to the bit line and a drain coupled to ground. For example, the secondary pre-charge transistor 233 comprises a source (S) coupled to BL[0] and a drain (D) coupled to ground (G).

Further, the control gate of each secondary pre-charge transistor is coupled to, or connected to, the control gate of the column select transistor so that both transistors receive a common control gate signal from a processor or other control circuit. For example, the control gate 234 of the secondary pre-charge transistor 233 is coupled, or connected, to the control gate 231 of Csel[0] at a node 232, and VCsel[0] is the common control gate signal. The control gate of the secondary pre-charge transistor 243 is coupled, or connected, to the control gate of Csel[1] at a node 242, and VCsel[1] is the common control gate signal. The control gate of the secondary pre-charge transistor 253 is coupled, or connected, to the control gate of Csel[7] at a node 252, and VCsel[7] is the common control gate signal.

The secondary pre-charge transistors are so-named because they have a role in maintaining the pre-charge of the respective bit line, in addition to the role of the primary pre-charge transistor. The secondary pre-charge transistors maintain the bit line voltage within a specified range, preventing it from getting so low that the respective column select transistor turns off, causing the bit line voltage to float.

FIG. 5B depicts an example circuit 550 representing a portion of the circuit of FIG. 2A, where a pre-charge transistor 553 controlled by the column select signal VCsel is added at the SP node, in accordance with various embodiments. The secondary pre-charge transistor 553 connected at the secondary pre-charge node (SP) reduces leakage and improves performance. The secondary pre-charge transistor may be a pMOS transistor, for example. Generally, the secondary pre-charge transistor can be of opposite polarity as the column select transistor. Since the column select transistor is an nMOS, the secondary pre-charge transistor is a pMOS. If the column select transistor is a pMOS, the secondary pre-charge transistor is an nMOS. Other types of transistors besides MOSFETs could be used as well.

The pMOS transistor 553 at its source side (S) is coupled to the bit line at the SP node. The pMOS transistor at its drain side (D) is coupled to ground. As a result, the SP node is prevented from having a floating voltage. Additionally, the control gate 554 of the pMOS transistor 553 is coupled to, or connected to, the control gate 531 of the nMOS transistor Csel so that they both receive the same control gate voltage signal, VCsel. This is the column select signal for a memory array or other group of cells. VCsel is provided at a node 552 which is a control gate path for the two connected transistors.

In a reduced power mode, if VCsel becomes so low that Csel begins to cutoff, the transistor 553 can begin to conduct to connect SP to ground to ensure that SP does not have a floating voltage in a read operation. Instead, the voltage of SP and the bit line is maintained in a specified range. As mentioned, for example, the specified range may be between Vthp and Vdd−Vthn, where Vthp is a threshold voltage of the pMOS transistor, Vth is a threshold voltage of the nMOS transistor and Vdd is the power supply voltage.

The secondary pre-charge transistor can be controlled directly by the column select signal so that no additional control lines are needed. When the column select signal is high, the pMOS will be off. Although the pMOS may contribute a small extra leakage in the read-0 condition and the read-1 condition, it will hold the SP node at the specified voltage range. Moreover, the voltage of the SP node/bit line will be always Vthn less than the voltage of the PP node to help to discharge the bit line faster and improve read-1 performance.

Figure 6:
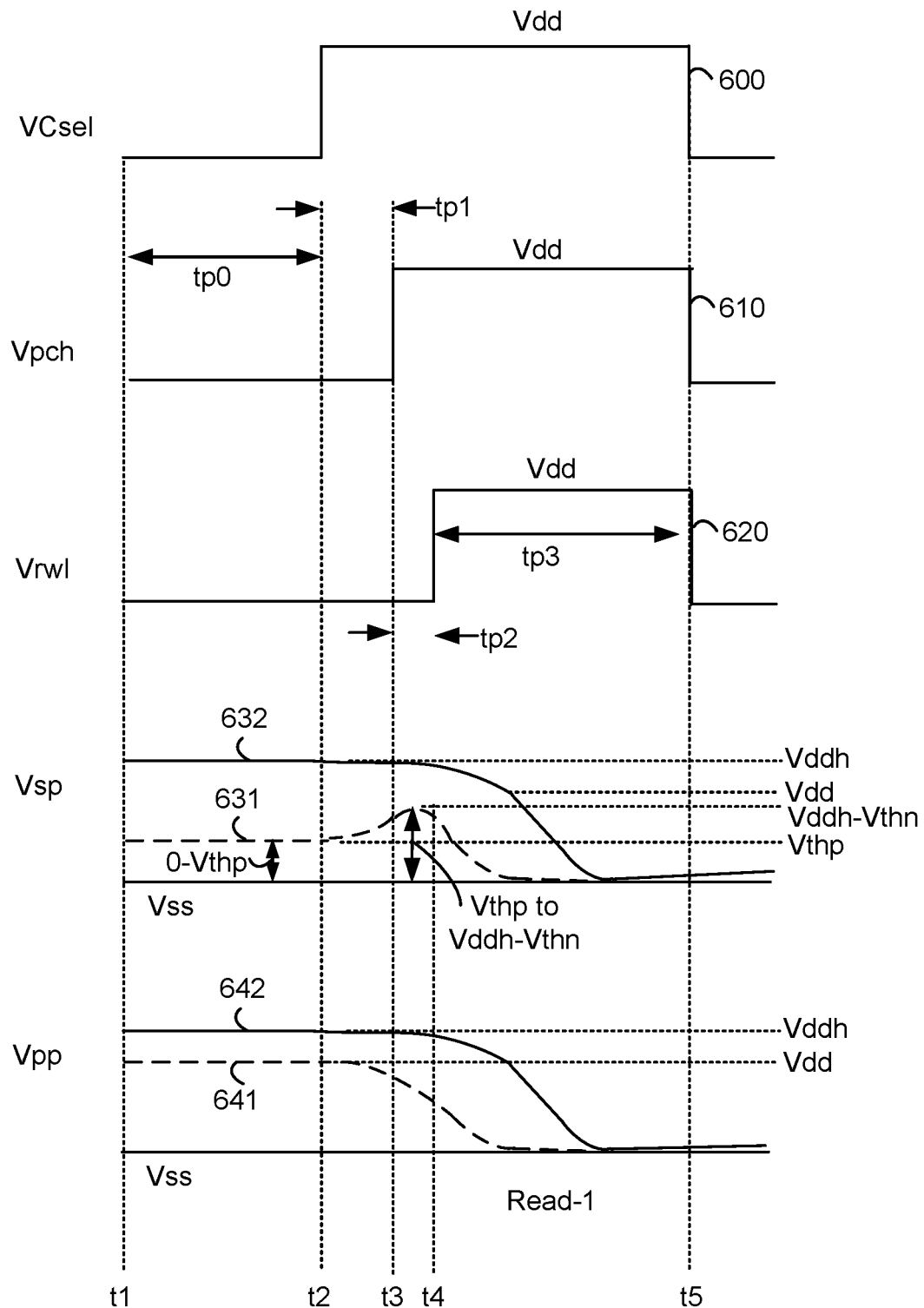
FIG. 6 depicts example waveforms in a read operation, with and without a secondary pre-charge transistor, in accordance with various embodiments.

When the nMOS transistor is off, the pMOS is on and when the nMOS transistor is on, the pMOS is off. Referring also to FIG. 6, in the pre-charge phase, the pMOS transistor will be ON, so the SP node (Vsp) will directly discharge through the pMOS as well as it will leak through all nMOS pull-downs. Because of that, the SP pre-charge node voltage level will vary in a range of 0 to Vthp. But, when Csel is ON at that time, there will not be any role for this pMOS transistor, it will work like a normal read-path. Within a short time, the SP node will be charged through the PP pre-charge. At that time, the voltage range will be in a range of Vthp to Vdd−Vthn.

FIG. 6 depicts example waveforms in a read operation, with and without a secondary pre-charge transistor, in accordance with various embodiments. This example assumes a previous cycle had a power supply at the Vddh level and that the current read operation has a power supply at the Vdd level.

A plot 600 denotes VCsel, a plot 610 denotes Vpch and a plot 620 denotes Vrwl. A plot 631 denotes Vsp and a plot 641 denotes Vpp for the case of a circuit with a secondary pre-charge transistor such as in FIGS. 5A and 5B. A plot 641 denotes Vsp and a plot 642 denotes Vpp for the case of a circuit without a secondary pre-charge transistor such as in FIGS. 2A and 2B. Plot 631 is at a low level of 0-Vthp from t1-t2 so that Csel is not prevented from turning on when it steps up at t2-t3. Vsp increases to a peak level in a range of Vthp to Vddh−Vthn from t2-t4, then decreases to 0 V after t4. The peak in Vsp follows Vpch going high at t3 to turn off the PCH transistor. Plot 632 is at a high level of Vddh from t1-t3, when Vsp is floating.

For example, assume Vddh=1.1 V and Vthn=0.1 V. Then, the peak value of Vsp in plot 631 is 1.1−0.1=1.0 V. A condition for turning on the Csel transistor is Vgs>Vthn or (Vdd−Vsp)>Vthn. Equivalently, Vsp should be less than Vdd−Vthn to allow sensing to occur.

During the read-1 operation, Vsp (plot 632) follows Vpp (plot 642) in decreasing from Vddh to 0 V. This decrease in Vpp is delayed relative to the decrease of plot 641 from Vdd to 0 V. Starting at t4, the column select transistor will be turned on once Vgs>Vthn. Vrwl goes high so that the memory cell can pull down the bit line depending on its data state.

Generally, the SP node is refreshed with Vthp in every cycle. Vthp is not function of the power supply. If the pMOS transistor is not used, Vsp at t1-t2 will be Vddh instead of in the range 0-Vthp. As the next cycle operating voltage is Vdd, and the pre-charge level is Vddh at the time of transition from Vddh to Vdd, that will create an issue in turning on the Csel device. Previously, it was voltage dependent. Now, a pre-charge path is created which is no longer dependent on the power supply. Instead, it depends on the threshold voltage of the newly added pMOS transistor. Vthp will not be more than Vddh or Vdd, so the Csel device will not be in a cutoff region.

Figure 7:
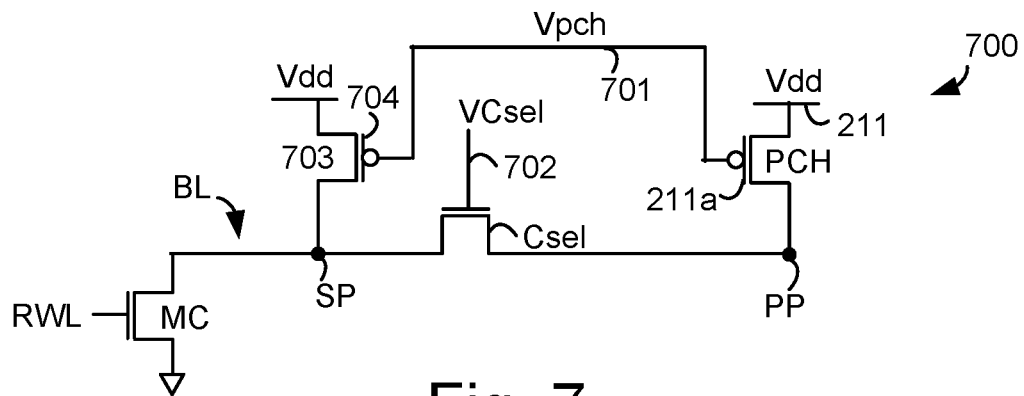
FIG. 7 depicts an example circuit 700 based on a portion of the circuit of FIG. 2A, where a pre-charge transistor 703 controlled by Vpch is added at the secondary pre-charge (SP) node, in accordance with various embodiments.

FIG. 7 depicts an example circuit 700 based on a portion of the circuit of FIG. 2A, where a pre-charge transistor 703 controlled by Vpch is added at the secondary pre-charge (SP) node, in accordance with various embodiments. Here, the pre-charge transistor is a pMOS transistor having a source coupled to the bit line at the SP node. The pMOS transistor 703 at its drain side is coupled to the power supply, Vdd. As a result, the SP node is prevented from having a floating voltage. This pMOS transistor can be considered to be a dedicated secondary pre-charge transistor. In this case, there is no performance impact between the reduced power mode (at Vdd) and the normal power mode (at Vddh). The control gate 704 of the pMOS transistor 703 is coupled to the control gate 211a of the pMOS transistor PCH via a path 701 so that they both receive the same control gate voltage signal, Vpch. The Csel transistor and its control gate 702, which receives a voltage VCsel, are also depicted.

Figure 8:
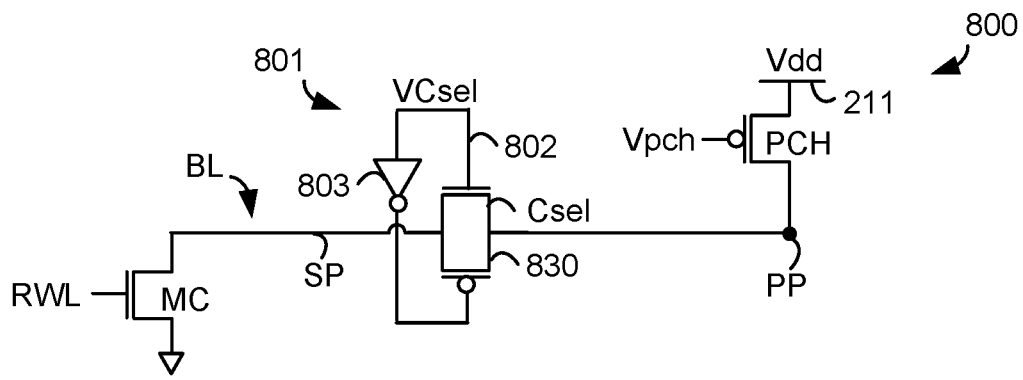
FIG. 8 depicts an example circuit 800 based on a portion of the circuit of FIG. 2A, where a transmission pass gate 801 is added at the SP node, in accordance with various embodiments.

FIG. 8 depicts an example circuit 800 based on a portion of the circuit of FIG. 2A, where a transmission pass gate 801 is added at the SP node, in accordance with various embodiments. The transmission pass gate 801 comprises an nMOS transistors Csel and a pMOS transistor 830 which share a common control gate path 802. An inverter 803 is in the control gate path. The transmission pass gate is used instead of a single nMOS column select transistor. It provides a discharge path for the SP node at the lower power supply voltage, Vdd. However, there will be an impact on performance since the SP node will be discharged from Vddp.

Figures 9, 10:
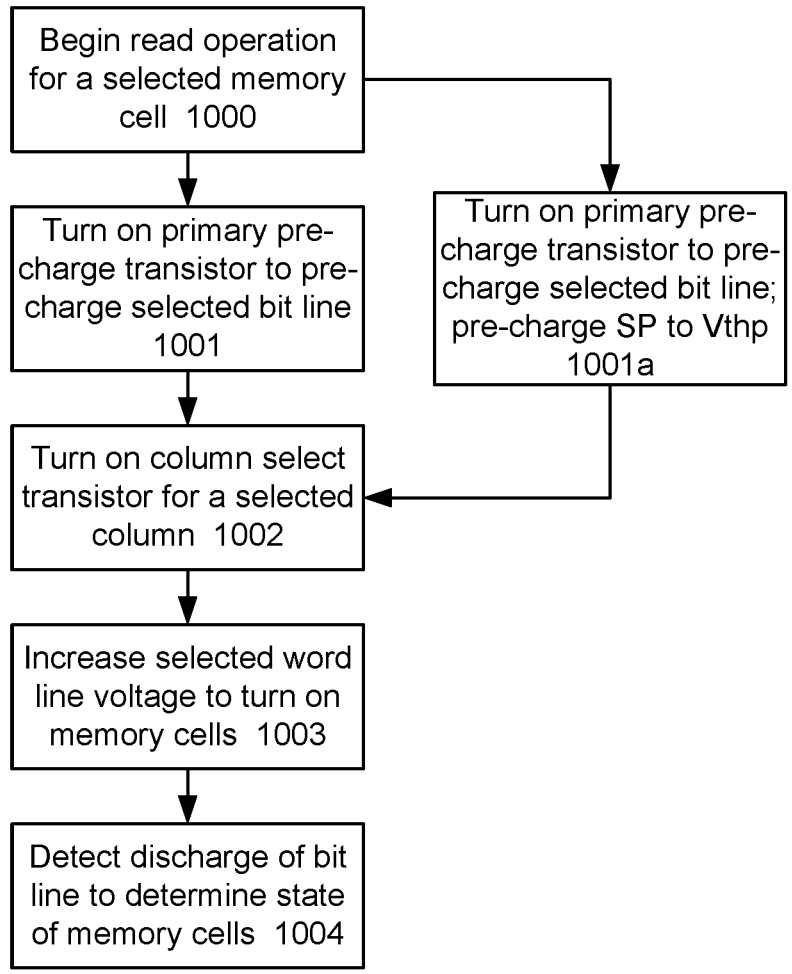
FIG. 9 depicts a table representing characteristics of the circuits of FIGS. 2B, 7 and 8, in accordance with various embodiments.
FIG. 10 depicts a flowchart of an example read operation, in accordance with various embodiments.

FIG. 9 depicts a table representing characteristics of the circuits of FIGS. 2B, 7 and 8, in accordance with various embodiments. The first column indicates the example circuit, the second column indicates whether there is a low power issue, the third column indicates the level of leakage power, the fourth column indicates the level of performance, e.g., read time, and the fifth column indicates the relative area needed for the circuit.

The example of FIG. 2B has a low power issue, and the leakage power, performance and area are at reference levels. The example of FIG. 7 does not have a low power issue, the leakage power is higher than the reference, the performance is lower than the reference and the area is the same as the reference. The example of FIG. 8 does not have a low power issue, the leakage power is higher than the reference, the performance is lower than the reference and the area is larger than the reference. There will be an impact on leakage or area with these circuits with some degradation on performance. The drawbacks of these examples are overcome by the circuits of FIGS. 5A and 5B.

FIG. 10 depicts a flowchart of an example read operation, in accordance with various embodiments. Step 1000 begins a read operation for a selected memory cell. In a first option which involves the circuits of FIGS. 2A and 2B, step 1001 includes turning on a primary pre-charge transistor to pre-charge a selected bit line. In a second option which involves the circuits of FIGS. 5A and 5B, step 1001a includes turning on a primary pre-charge transistor to pre-charge a selected bit line, and pre-charging the SP node to 0-Vthp, as in FIG. 6, plot 631 at t1-t2. Step 1002 includes turning on a column select transistor for a selected column. See, e.g., t2-t5 and plot 600 in FIG. 6. Step 1003 includes increasing a selected word line voltage to a turn on level. See, e.g., t4-t5 and plot 620 in FIG. 6. Step 1004 includes detecting the discharge of the bit line to determine a state of the memory cell. See, e.g., t4-t5 in FIG. 6.

Figure 11:
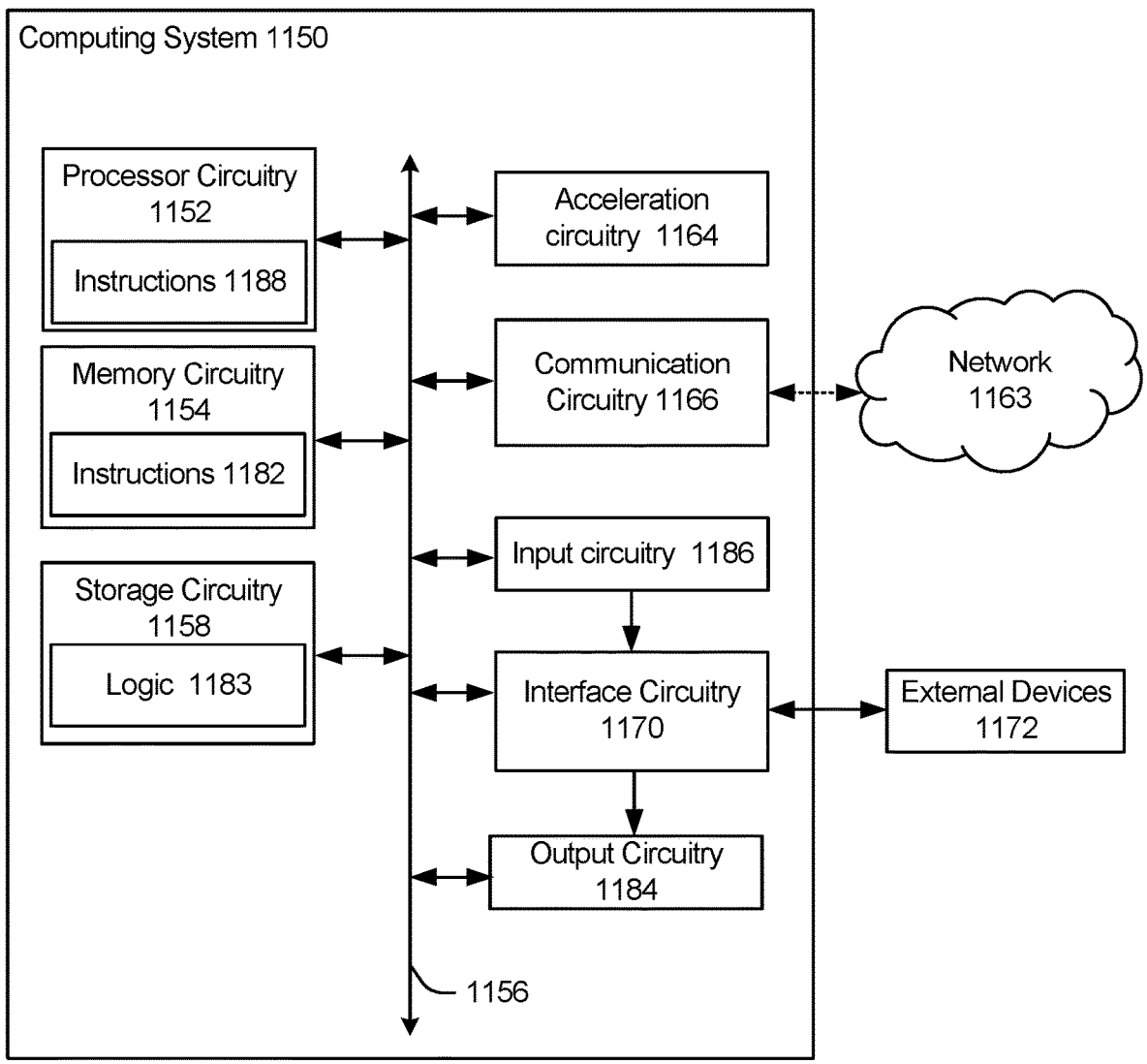
FIG. 11 illustrates an example of components that may be present in a computing system 1150 for implementing the techniques (e.g., operations, processes, methods, and methodologies) described herein.

FIG. 11 illustrates an example of components that may be present in a computing system 1150 for implementing the techniques (e.g., operations, processes, methods, and methodologies) described herein. The computing system 1150 may include any combinations of the hardware or logical components referenced herein. The components may be implemented as ICs, portions thereof, discrete electronic devices, or other modules, instruction sets, programmable logic or algorithms, hardware, hardware accelerators, software, firmware, or a combination thereof adapted in the computing system 1150, or as components otherwise incorporated within a chassis of a larger system. For one embodiment, at least one processor 1152 may be packaged together with computational logic 1182 and configured to practice aspects of various example embodiments described herein to form a System in Package (SiP) or a System on a Chip (SoC).

The system 1150 includes processor circuitry in the form of one or more processors 1152. The processor circuitry 1152 includes circuitry such as, but not limited to one or more processor cores and one or more of cache memory, low drop-out voltage regulators (LDOs), interrupt controllers, serial interfaces such as SPI, I2C or universal programmable serial interface circuit, real time clock (RTC), timer-counters including interval and watchdog timers, general purpose I/O, memory card controllers such as secure digital/multi-media card (SD/MMC) or similar, interfaces, mobile industry processor interface (MIPI) interfaces and Joint Test Access Group (JTAG) test access ports. In some implementations, the processor circuitry 1152 may include one or more hardware accelerators (e.g., same or similar to acceleration circuitry 1164), which may be microprocessors, programmable processing devices (e.g., FPGA, ASIC, etc.), or the like. The one or more accelerators may include, for example, computer vision and/or deep learning accelerators. In some implementations, the processor circuitry 1152 may include on-chip memory circuitry, which may include any suitable volatile and/or non-volatile memory, such as DRAM, SRAM, EPROM, EEPROM, Flash memory, solid-state memory, and/or any other type of memory device technology, such as those discussed herein The processor circuitry 1152 may include, for example, one or more processor cores (CPUs), application processors, GPUs, RISC processors, Acorn RISC Machine (ARM) processors, CISC processors, one or more DSPs, one or more FPGAs, one or more PLDs, one or more ASICs, one or more baseband processors, one or more radio-frequency integrated circuits (RFIC), one or more microprocessors or controllers, a multi-core processor, a multithreaded processor, an ultra-low voltage processor, an embedded processor, or any other known processing elements, or any suitable combination thereof. The processors (or cores) 1152 may be coupled with or may include memory/storage and may be configured to execute instructions stored in the memory/storage to enable various applications or operating systems to run on the platform 1150. The processors (or cores) 1152 is configured to operate application software to provide a specific service to a user of the platform 1150. In some embodiments, the processor(s) 1152 may be a special-purpose processor(s)/controller(s) configured (or configurable) to operate according to the various embodiments herein.

As examples, the processor(s) 1152 may include an Intel® Architecture Core™ based processor such as an i3, an i5, an i7, an i9 based processor; an Intel® microcontroller-based processor such as a Quark™, an Atom™, or other MCU-based processor; Pentium® processor(s), Xeon® processor(s), or another such processor available from Intel® Corporation, Santa Clara, California. However, any number other processors may be used, such as one or more of Advanced Micro Devices (AMD) Zen® Architecture such as Ryzen® or EPYC® processor(s), Accelerated Processing Units (APUs), MxGPUs, Epyc® processor(s), or the like; A5-A12 and/or S1-S4 processor(s) from Apple® Inc., Snapdragon™ or Centriq™ processor(s) from Qualcomm® Technologies, Inc., Texas Instruments, Inc.® Open Multimedia Applications Platform(OMAP)™ processor(s); a MIPS-based design from MIPS Technologies, Inc. such as MIPS Warrior M-class, Warrior I-class, and Warrior P-class processors; an ARM-based design licensed from ARM Holdings, Ltd., such as the ARM Cortex-A, Cortex-R, and Cortex-M family of processors; the ThunderX2® provided by Cavium™, Inc.; or the like. In some implementations, the processor(s) 1152 may be a part of a system on a chip (SoC), System-in-Package (SiP), a multi-chip package (MCP), and/or the like, in which the processor(s) 1152 and other components are formed into a single integrated circuit, or a single package, such as the Edison™ or Galileo™ SoC boards from Intel® Corporation. Other examples of the processor(s) 1152 are mentioned elsewhere in the present disclosure.

The system 1150 may include or be coupled to acceleration circuitry 1164, which may be embodied by one or more AI/ML accelerators, a neural compute stick, neuromorphic hardware, an FPGA, an arrangement of GPUs, one or more SoCs (including programmable SoCs), one or more CPUs, one or more digital signal processors, dedicated ASICs (including programmable ASICs), PLDs such as complex (CPLDs) or high complexity PLDs (HCPLDs), and/or other forms of specialized processors or circuitry designed to accomplish one or more specialized tasks. These tasks may include AI/ML processing (e.g., including training, inferencing, and classification operations), visual data processing, network data processing, object detection, rule analysis, or the like. In FPGA-based implementations, the acceleration circuitry 1164 may comprise logic blocks or logic fabric and other interconnected resources that may be programmed (configured) to perform various functions, such as the procedures, methods, functions, etc. of the various embodiments discussed herein. In such implementations, the acceleration circuitry 1164 may also include memory cells (e.g., EPROM, EEPROM, flash memory, static memory (e.g., SRAM, anti-fuses, etc.) used to store logic blocks, logic fabric, data, etc. in LUTs and the like.

In some implementations, the processor circuitry 1152 and/or acceleration circuitry 1164 may include hardware elements specifically tailored for machine learning and/or artificial intelligence (AI) functionality. In these implementations, the processor circuitry 1152 and/or acceleration circuitry 1164 may be, or may include, an AI engine chip that can run many different kinds of AI instruction sets once loaded with the appropriate weightings and training code. Additionally or alternatively, the processor circuitry 1152 and/or acceleration circuitry 1164 may be, or may include, AI accelerator(s), which may be one or more of the aforementioned hardware accelerators designed for hardware acceleration of AI applications. As examples, these processor(s) or accelerators may be a cluster of artificial intelligence (AI) GPUs, tensor processing units (TPUs) developed by Google® Inc., Real AI Processors (RAPs™) provided by AlphaICs®, Nervana™ Neural Network Processors (NNPs) provided by Intel® Corp., Intel® Movidius™ Myriad™ X Vision Processing Unit (VPU), NVIDIA® PX™ based GPUs, the NM500 chip provided by General Vision®, Hardware 3 provided by Tesla®, Inc., an Epiphany™ based processor provided by Adapteva®, or the like. In some embodiments, the processor circuitry 1152 and/or acceleration circuitry 1164 and/or hardware accelerator circuitry may be implemented as AI accelerating co-processor(s), such as the Hexagon 685 DSP provided by Qualcomm®, the PowerVR 2NX Neural Net Accelerator (NNA) provided by Imagination Technologies Limited®, the Neural Engine core within the Apple® A11 or A12 Bionic SoC, the Neural Processing Unit (NPU) within the HiSilicon Kirin 970 provided by Huawei®, and/or the like. In some hardware-based implementations, individual subsystems of system 1150 may be operated by the respective AI accelerating co-processor(s), AI GPUs, TPUs, or hardware accelerators (e.g., FPGAs, ASICs, DSPs, SoCs, etc.), etc., that are configured with appropriate logic blocks, bit stream(s), etc. to perform their respective functions.

The system 1150 also includes system memory 1154. Any number of memory devices may be used to provide for a given amount of system memory. As examples, the memory 1154 may be, or include, volatile memory such as random access memory (RAM), static RAM (SRAM), dynamic RAM (DRAM), synchronous DRAM (SDRAM), RAMBUS® Dynamic Random Access Memory (RDRAM®), and/or any other desired type of volatile memory device. Additionally or alternatively, the memory 1154 may be, or include, non-volatile memory such as read-only memory (ROM), erasable programmable ROM (EPROM), electrically erasable programmable (EEPROM), flash memory, non-volatile RAM, ferroelectric RAM, phase-change memory (PCM), flash memory, and/or any other desired type of non-volatile memory device. Access to the memory 1154 is controlled by a memory controller. The individual memory devices may be of any number of different package types such as single die package (SDP), dual die package (DDP) or quad die package (Q17P). Any number of other memory implementations may be used, such as dual inline memory modules (DIMMs) of different varieties including but not limited to microDIMMs or MiniDIMMs.

Storage circuitry 1158 provides persistent storage of information such as data, applications, operating systems and so forth. In an example, the storage 1158 may be implemented via a solid-state disk drive (SSDD) and/or high-speed electrically erasable memory (commonly referred to as "flash memory"). Other devices that may be used for the storage 1158 include flash memory cards, such as SD cards, microSD cards, XD picture cards, and the like, and USB flash drives. In an example, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, phase change RAM (PRAM), resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a Domain Wall (DW) and Spin Orbit Transfer (SOT) based device, a thyristor based memory device, a hard disk drive (HDD), micro HDD, of a combination thereof, and/or any other memory. The memory circuitry 1154 and/or storage circuitry 1158 may also incorporate three-dimensional (3D) cross-point (XPOINT) memories from Intel® and Micron®.

The memory circuitry 1154 and/or storage circuitry 1158 is/are configured to store computational logic 1183 in the form of software, firmware, microcode, or hardware-level instructions to implement the techniques described herein. The computational logic 1183 may be employed to store working copies and/or permanent copies of programming instructions, or data to create the programming instructions, for the operation of various components of system 1150 (e.g., drivers, libraries, application programming interfaces (APIs), etc.), an operating system of system 1150, one or more applications, and/or for carrying out the embodiments discussed herein. The computational logic 1183 may be stored or loaded into memory circuitry 1154 as instructions 1182, or data to create the instructions 1182, which are then accessed for execution by the processor circuitry 1152 to carry out the functions described herein. The processor circuitry 1152 and/or the acceleration circuitry 1164 accesses the memory circuitry 1154 and/or the storage circuitry 1158 over the interconnect (IX) 1156. The instructions 1182 direct the processor circuitry 1152 to perform a specific sequence or flow of actions, for example, as described with respect to flowchart(s) and block diagram(s) of operations and functionality depicted previously. The various elements may be implemented by assembler instructions supported by processor circuitry 1152 or high-level languages that may be compiled into instructions 1188, or data to create the instructions 1188, to be executed by the processor circuitry 1152. The permanent copy of the programming instructions may be placed into persistent storage devices of storage circuitry 1158 in the factory or in the field through, for example, a distribution medium (not shown), through a communication interface (e.g., from a distribution server (not shown)), over-the-air (OTA), or any combination thereof.

The IX 1156 couples the processor 1152 to communication circuitry 1166 for communications with other devices, such as a remote server (not shown) and the like. The communication circuitry 1166 is a hardware element, or collection of hardware elements, used to communicate over one or more networks 1163 and/or with other devices. In one example, communication circuitry 1166 is, or includes, transceiver circuitry configured to enable wireless communications using any number of frequencies and protocols such as, for example, the Institute of Electrical and Electronics Engineers (IEEE) 802.11 (and/or variants thereof), IEEE 802.23.4, Bluetooth® and/or Bluetooth® low energy (BLE), ZigBee®, LoRaWAN™ (Long Range Wide Area Network), a cellular protocol such as 3GPP LTE and/or Fifth Generation (5G)/New Radio (NR), and/or the like. Additionally or alternatively, communication circuitry 1166 is, or includes, one or more network interface controllers (NICs) to enable wired communication using, for example, an Ethernet connection, Controller Area Network (CAN), Local Interconnect Network (LIN), DeviceNet, ControlNet, Data Highway+, or PROFINET, among many others.

The IX 1156 also couples the processor 1152 to interface circuitry 1170 that is used to connect system 1150 with one or more external devices 1172. The external devices 1172 may include, for example, sensors, actuators, positioning circuitry (e.g., global navigation satellite system (GNSS)/Global Positioning System (GPS) circuitry), client devices, servers, network appliances (e.g., switches, hubs, routers, etc.), integrated photonics devices (e.g., optical neural network (ONN) integrated circuit (IC) and/or the like), and/or other like devices.

In some optional examples, various input/output (I/O) devices may be present within or connected to, the system 1150, which are referred to as input circuitry 1186 and output circuitry 1184 in FIG. 11. The input circuitry 1186 and output circuitry 1184 include one or more user interfaces designed to enable user interaction with the platform 1150 and/or peripheral component interfaces designed to enable peripheral component interaction with the platform 1150. Input circuitry 1186 may include any physical or virtual means for accepting an input including, inter alia, one or more physical or virtual buttons (e.g., a reset button), a physical keyboard, keypad, mouse, touchpad, touchscreen, microphones, scanner, headset, and/or the like. The output circuitry 1184 may be included to show information or otherwise convey information, such as sensor readings, actuator position(s), or other like information. Data and/or graphics may be displayed on one or more user interface components of the output circuitry 1184. Output circuitry 1184 may include any number and/or combinations of audio or visual display, including, inter alia, one or more simple visual outputs/indicators (e.g., binary status indicators (e.g., light emitting diodes (LEDs)) and multi-character visual outputs, or more complex outputs such as display devices or touchscreens (e.g., Liquid Crystal Displays (LCD), LED displays, quantum dot displays, projectors, etc.), with the output of characters, graphics, multimedia objects, and the like being generated or produced from the operation of the platform 1150. The output circuitry 1184 may also include speakers and/or other audio emitting devices, printer(s), and/or the like. Additionally or alternatively, sensor(s) may be used as the input circuitry 1184 (e.g., an image capture device, motion capture device, or the like) and one or more actuators may be used as the output device circuitry 1184 (e.g., an actuator to provide haptic feedback or the like). Peripheral component interfaces may include, but are not limited to, a non-volatile memory port, a USB port, an audio jack, a power supply interface, etc. In some embodiments, a display or console hardware, in the context of the present system, may be used to provide output and receive input of an edge computing system; to manage components or services of an edge computing system; identify a state of an edge computing component or service; or to conduct any other number of management or administration functions or service use cases.

The components of the system 1150 may communicate over the IX 1156. The IX 1156 may include any number of technologies, including ISA, extended ISA, I2C, SPI, point-to-point interfaces, power management bus (PMBus), PCI, PCIe, PCIx, Intel® UPI, Intel® Accelerator Link, Intel® CXL, CAPI, OpenCAPI, Intel® QPI, UPI, Intel® OPA IX, RapidIO™ system IXs, CCIX, Gen-Z Consortium IXs, a HyperTransport interconnect, NVLink provided by NVIDIA®, a Time-Trigger Protocol (TTP) system, a FlexRay system, PROFIBUS, and/or any number of other IX technologies. The IX 1156 may be a proprietary bus, for example, used in a SoC based system.

The number, capability, and/or capacity of the elements of system 1150 may vary, depending on whether computing system 1150 is used as a stationary computing device (e.g., a server computer in a data center, a workstation, a desktop computer, etc.) or a mobile computing device (e.g., a smartphone, tablet computing device, laptop computer, game console, IoT device, etc.). In various implementations, the computing device system 1150 may comprise one or more components of a data center, a desktop computer, a workstation, a laptop, a smartphone, a tablet, a digital camera, a smart appliance, a smart home hub, a network appliance, and/or any other device/system that processes data.

The techniques described herein can be performed partially or wholly by software or other instructions provided in a machine-readable storage medium(e.g., memory). The software is stored as processor-executable instructions (e.g., instructions to implement any other processes discussed herein). Instructions associated with the flowchart (and/or various embodiments) and executed to implement embodiments of the disclosed subject matter may be implemented as part of an operating system or a specific application, component, program, object, module, routine, or other sequence of instructions or organization of sequences of instructions.

The storage medium can be a tangible machine readable medium such as read only memory (ROM), random access memory (RAM), flash memory devices, floppy and other removable disks, magnetic storage media, optical storage media (e.g., Compact Disk Read-Only Memory (CD ROMS), Digital Versatile Disks (DVDs)), among others.

The storage medium may be included, e.g., in a communication device, a computing device, a network device, a personal digital assistant, a manufacturing tool, a mobile communication device, a cellular phone, a notebook computer, a tablet, a game console, a set top box, an embedded system, a TV (television), or a personal desktop computer.

Some non-limiting examples of various embodiments are presented below.

Example 1 includes an apparatus, comprising: a column of memory cells coupled to a bit line; a primary pre-charge transistor coupled to the bit line; a secondary pre-charge transistor coupled to the bit line; and a column select transistor coupled to the bit line between the primary pre-charge transistor and the secondary pre-charge transistor, wherein a control gate of the secondary pre-charge transistor is coupled to a control gate of the column select transistor.

Example 2 includes the apparatus of Example 1, wherein the secondary pre-charge transistor comprises a source coupled to the bit line and a drain at ground.

Example 3 includes the apparatus of Example 2, wherein the column select transistor is an nMOS transistor and the secondary pre-charge transistor is a pMOS transistor; and the nMOS transistor comprises a drain coupled to the primary pre-charge transistor (PP) and a source coupled to the bit line.

Example 4 includes the apparatus of Example 2, wherein in a read operation of a memory cell of the column of memory cells, the pMOS transistor is to hold its source at a voltage level between Vthp and Vdd−Vthn, where Vthp is a threshold voltage of the pMOS transistor, Vth is a threshold voltage of the nMOS transistor and Vdd is a voltage provided by the primary pre-charge transistor.

Example 5 includes the apparatus of Examples 1-4, wherein the secondary pre-charge transistor is to prevent floating of a voltage of the bit line during a read operation of a memory cell of the column of memory cells.

Example 6 includes the apparatus of Examples 1-5, wherein the column is in a set of columns and the column select transistor is to receive a select signal when the column is selected in the set of columns for a read operation.

Example 7 includes the apparatus of Examples 1-6, wherein the column is in a set of columns; each column in the set of columns is coupled to a respective bit line; the primary pre-charge transistor is coupled to each respective bit line; a respective secondary pre-charge transistor is coupled to each respective bit line; a respective column select transistor is coupled to each respective bit line between the primary pre-charge transistor and the respective secondary pre-charge transistor; and for each respective bit line, a control gate of the respective secondary pre-charge transistor is coupled to a control gate of the respective column select transistor.

Example 8 includes the apparatus of Examples 1-7, wherein a set of word lines, wherein each memory cell comprises a control gate coupled to a respective word line in the set of word lines, a drain coupled to the bit line and a source coupled to ground.

Example 9 includes the apparatus of Examples 1-8, wherein the memory cells comprise read-only memory (ROM) cells.

Example 10 includes the apparatus of Examples 1-9, wherein the column select transistor and the secondary pre-charge transistor are commonly controlled by a column select signal.

Example 11 includes an apparatus, comprising: a memory device to store instructions; and a processor to execute the instructions to: perform a first phase of a read operation for a selected memory cell in a column of memory cells, wherein the column of memory cells is coupled to a bit line, a primary pre-charge transistor is coupled to the bit line, a secondary pre-charge transistor is coupled to the bit line, a control gate of the primary pre-charge transistor is coupled to a control gate of the secondary pre-charge transistor, a column select transistor is coupled to the bit line between the primary pre-charge transistor and the secondary pre-charge transistor, and the first phase is to turn on the primary pre-charge transistor while a control gate voltage for the selected memory is turned off to pre-charge the bit line; and perform a second phase of the read operation, wherein the second phase is to apply a turn on control gate voltage to the column select transistor, a turn off control gate voltage to the primary pre-charge transistor and a turn on control gate voltage to the selected memory cell, where a voltage of the bit line is detected to determine a state of the selected memory cell.

Example 12 includes the apparatus of Example 11, wherein the column select transistor has a first polarity; and the secondary pre-charge transistor has a second polarity, opposite to the first polarity.

Example 13 includes the apparatus of Example 11 or 12, wherein the secondary pre-charge transistor is to prevent floating of a voltage of the bit line during the first and second phases of the read operation.

Example 14 includes the apparatus of Examples 11-13, wherein the secondary pre-charge transistor is to maintain a voltage of the bit line in a specified range which is a function of a power supply voltage in the apparatus.

Example 15 includes the apparatus of Example 14, wherein the column select transistor is an nMOS transistor; the secondary pre-charge transistor is a pMOS transistor; and the specified range is between Vthp and Vdd−Vthn, where Vthp is a threshold voltage of the pMOS transistor, Vth is a threshold voltage of the nMOS transistor and Vdd is the power supply voltage.

Example 16 includes an apparatus, comprising: a column of memory cells coupled to a bit line; an nMOS column select transistor coupled to the bit line and to a pre-charge node; a pMOS transistor coupled to the bit line and to ground; the nMOS column select transistor is to allow a pre-charge of the bit line from the pre-charge node in a first phase of a read operation and a discharge of the bit line in a second phase of the read operation, the second phase follows the first phase; and the pMOS transistor is to maintain a voltage of the bit line in a specified range during the first and second phases of the read operation.

Example 17 includes the apparatus of Example 16, wherein a control gate of the pMOS transistor is coupled to a control gate of the nMOS column select transistor.

Example 18 includes the apparatus of Examples 16 and 17, wherein the specified range is between Vthp and Vdd−Vthn, where Vthp is a threshold voltage of the pMOS transistor, Vth is a threshold voltage of the nMOS transistor and Vdd is a power supply voltage of the primary pre-charge transistor.

Example 19 includes the apparatus of Examples 16-18, wherein the secondary pre-charge transistor is to prevent floating of a voltage of the bit line during the first and second phases of the read operation.

Example 20 includes the apparatus of Examples 16-19, wherein the bit line is among a plurality of respective bit lines; the plurality of respective bit lines are coupled to the pre-charge node; a respective nMOS column select transistor is coupled to each respective bit line and to the pre-charge node; a respective pMOS transistor is coupled to each respective bit line and to ground; and for each respective bit line, the respective nMOS column select transistor has a control gate coupled to a control gate of the respective pMOS transistor to receive a common control signal.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus, comprising:
a column of memory cells coupled to a bit line;
a primary pre-charge transistor coupled to the bit line;
a secondary pre-charge transistor coupled to the bit line; and
a column select transistor coupled to the bit line between the primary pre-charge transistor and the secondary pre-charge transistor, wherein a control gate of the secondary pre-charge transistor is connected to a control gate of the column select transistor.

2. The apparatus of claim 1, wherein:
the secondary pre-charge transistor comprises a source coupled to the bit line and a drain at ground.

3. The apparatus of claim 2, wherein:
the column select transistor is an nMOS transistor and the secondary pre-charge transistor is a pMOS transistor; and
the nMOS transistor comprises a drain coupled to the primary pre-charge transistor (PP) and a source coupled to the bit line.

4. The apparatus of claim 3, wherein:
in a read operation of a memory cell of the column of memory cells, the pMOS transistor is to hold its source at a voltage level between Vthp and Vdd−Vthn, where Vthp is a threshold voltage of the pMOS transistor, Vthn is a threshold voltage of the nMOS transistor, and Vdd is a voltage provided by the primary pre-charge transistor.

5. The apparatus of claim 1, wherein:
the secondary pre-charge transistor is to prevent floating of a voltage of the bit line during a read operation of a memory cell of the column of memory cells.

6. The apparatus of claim 1, wherein:
the column is in a set of columns and the column select transistor is to receive a select signal when the column is selected in the set of columns for a read operation.

7. The apparatus of claim 1, wherein:
the column is in a set of columns;
each column in the set of columns is coupled to a respective bit line;
the primary pre-charge transistor is coupled to each respective bit line;
a respective secondary pre-charge transistor is coupled to each respective bit line;
a respective column select transistor is coupled to each respective bit line between the primary pre-charge transistor and the respective secondary pre-charge transistor; and
for each respective bit line, a control gate of the respective secondary pre-charge transistor is coupled to a control gate of the respective column select transistor.

8. The apparatus of claim 1, further comprising:
a set of word lines, wherein each memory cell comprises a control gate coupled to a respective word line in the set of word lines, a drain coupled to the bit line, and a source coupled to ground.

9. The apparatus of claim 1, wherein the memory cells comprise read-only memory (ROM) cells.

10. The apparatus of claim 1, wherein:
the column select transistor and the secondary pre-charge transistor are commonly controlled by a column select signal.

11. An apparatus, comprising:
a column of memory cells coupled to a bit line;
an nMOS column select transistor coupled to the bit line and to a pre-charge node;
a pMOS transistor coupled to the bit line and to ground;
the nMOS column select transistor is to allow a pre-charge of the bit line from the pre-charge node in a first phase of a read operation and a discharge of the bit line in a second phase of the read operation, the second phase follows the first phase; and
the pMOS transistor is to maintain a voltage of the bit line in a specified range during the first and second phases of the read operation.

12. The apparatus of claim 11, wherein:
a control gate of the pMOS transistor is coupled to a control gate of the nMOS column select transistor.

13. The apparatus of claim 11, wherein:
the specified range is between Vthp and Vdd−Vthn, where Vthp is a threshold voltage of the pMOS transistor, Vthn is a threshold voltage of the nMOS column select transistor, and Vdd is a power supply voltage of a primary pre-charge transistor.

14. The apparatus of claim 11, wherein:
the pMOS transistor is to prevent floating of a voltage of the bit line during the first and second phases of the read operation.

15. The apparatus of claim 11, wherein:
the bit line is among a plurality of respective bit lines;
the plurality of respective bit lines are coupled to the pre-charge node;
a respective nMOS column select transistor is coupled to each respective bit line and to the pre-charge node;
a respective pMOS transistor is coupled to each respective bit line and to ground; and
for each respective bit line, the respective nMOS column select transistor has a control gate coupled to a control gate of the respective pMOS transistor to receive a common control signal.

* * * * *